United States Patent
Koposov

(10) Patent No.: US 9,598,283 B1
(45) Date of Patent: Mar. 21, 2017

(54) SYNTHESIS METHOD FOR CONTROLLING ANTIMONY SELENIDE NANOSTRUCTURE SHAPES

(71) Applicant: Sharp Laboratories of America (SLA), Inc., Camas, WA (US)

(72) Inventor: Alexey Koposov, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 14/866,044

(22) Filed: Sep. 25, 2015

(51) Int. Cl.
*B82Y 30/00* (2011.01)
*C01B 19/00* (2006.01)
*H01L 31/0272* (2006.01)
*H01L 31/0352* (2006.01)

(52) U.S. Cl.
CPC ........ *C01B 19/007* (2013.01); *H01L 31/0272* (2013.01); *H01L 31/035209* (2013.01); *C01P 2004/16* (2013.01); *C01P 2004/34* (2013.01); *C01P 2004/64* (2013.01); *C01P 2006/40* (2013.01)

(58) Field of Classification Search
None
See application file for complete search history.

(56) References Cited

U.S. PATENT DOCUMENTS 7,615,169 B2 11/2009 Strouse et al.
9,209,374 B2 * 12/2015 Peng ............... H01L 35/16

FOREIGN PATENT DOCUMENTS

CN 1394599 2/2003
WO WO 2010124212 10/2010

OTHER PUBLICATIONS

"Toward Antimony Selenide Sensitized Solar Cells: Efficient Charge Photogeneration . . . ", J. Phys. Chem. Lett., 2012, 3 (10), pp. 1351-1356 DOI: 10.1021/jz3004365.
"Preparation and characterization of wire-like Sb2Se3 and flake-like Bi2Se3 nanocrystals" Journal of Crystal Growth vol. 253, Issues 1-4, Jun. 2003, pp. 445-451.
"One-dimensional Sb2Se3 nanostructures: solvothermal synthesis, growth mechanism, optical and electrochemical properties" CrystEngComm, 2011,13, 2369-2374 DOI: 10.1039/C0CE00.

(Continued)

*Primary Examiner* — Melvin C Mayes
*Assistant Examiner* — Stefanie Cohen
(74) *Attorney, Agent, or Firm* — Law Office of Gerald Maliszewski; Gerald Maliszewski

(57) ABSTRACT

Methods are provided for controlling the shape of antimony selenide ($Sb_2Se_3$) synthesized nanostructures. The method dissolves an antimony (III) salt in a first amount of carboxylic acid, forming an antimony precursor. In one aspect, antimony (III) chloride is dissolved in oleic acid. Separately, selenourea is dissolved in oleylamine, forming a selenium precursor. The antimony precursor is combined with the selenium precursor to form a first solution and cause a reaction. The reaction is quenched with a solvent having a low boiling point. In response to quenching the reaction in the first solution, antimony selenide nanorods are formed, having a length in the range of 150-200 nanometers (nm) and a diameter in the range of 20 to 30 nm. Related methods can be used to create, shorter nanorods, nanocrystals, and hollow nanospheres.

18 Claims, 4 Drawing Sheets

(56) References Cited

OTHER PUBLICATIONS

"High Electrical Conductivity Antimony Selenide Nanocrystals and Assemblies" DOI: 10.1021/nl1020848 | Nano Lett. 2010, 10, 4417-4422.

"Electrodeposition of Antimony Selenide Thin Films and Application in Semiconductor Sensitized Solar Cells", ACS Appl. Amter. Interfaces, 2014, 6 (4), pp. 2836-2841.

* cited by examiner

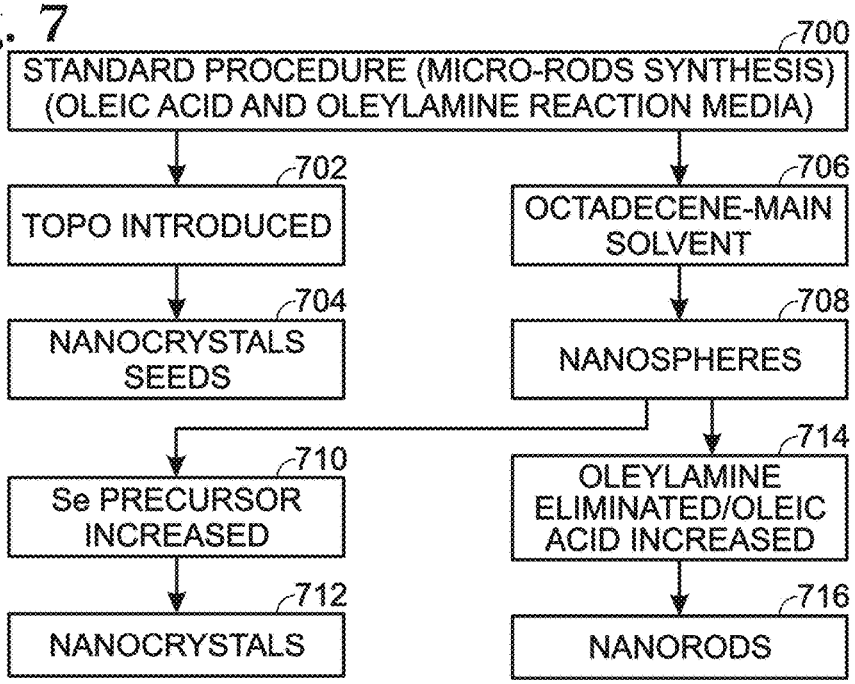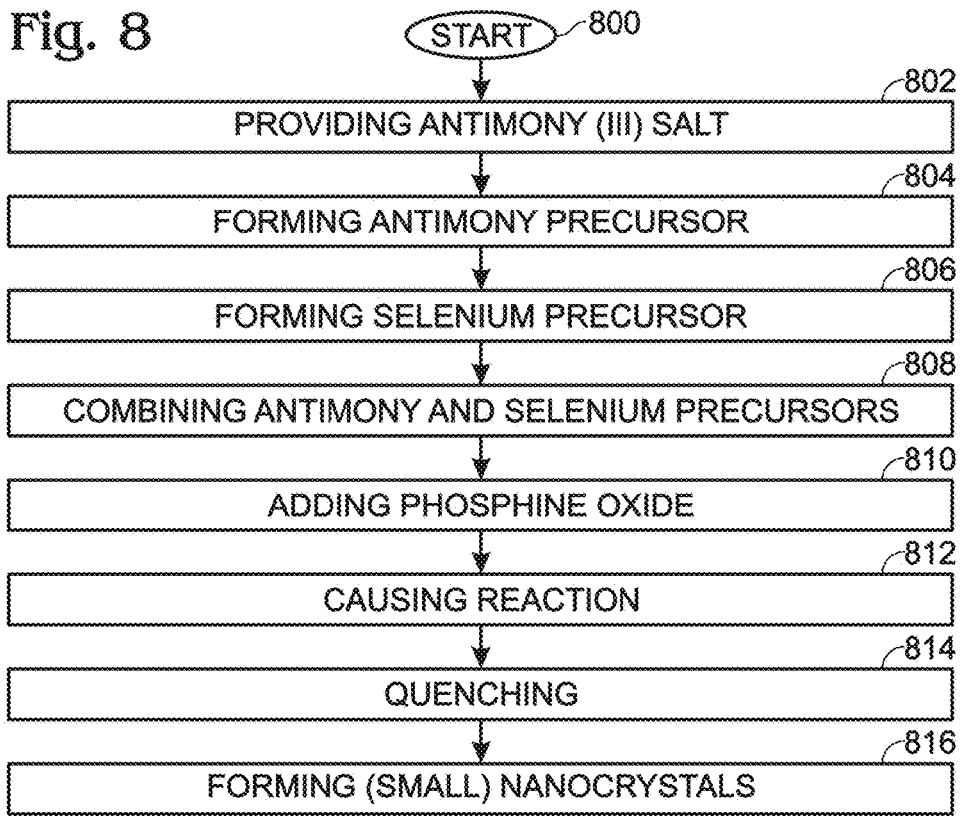

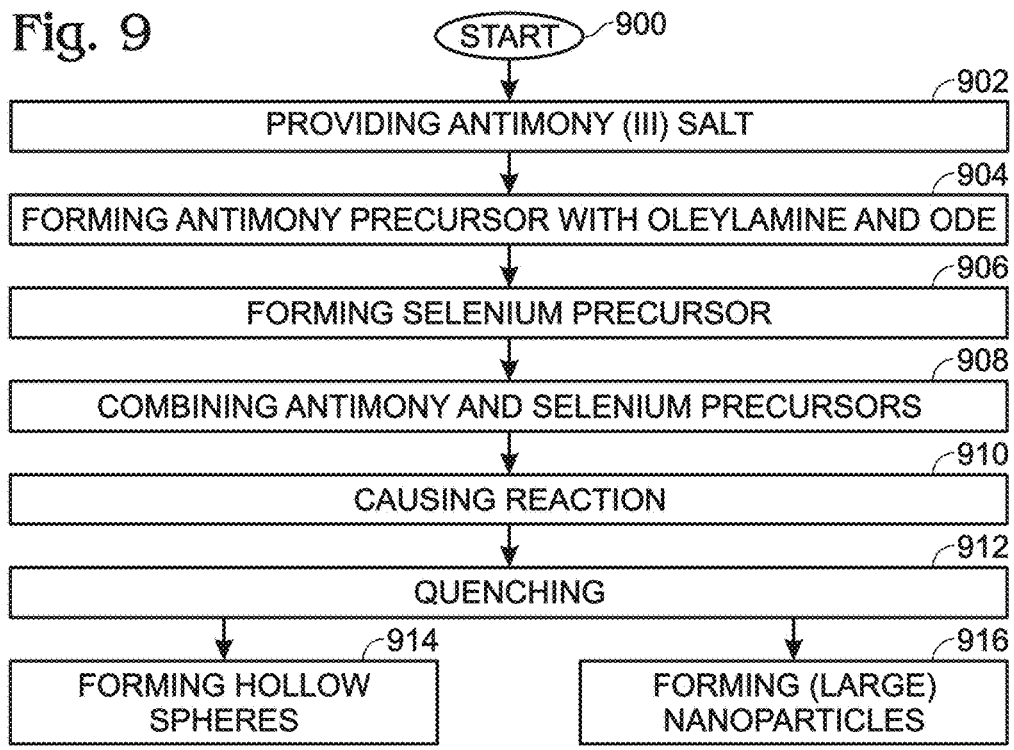
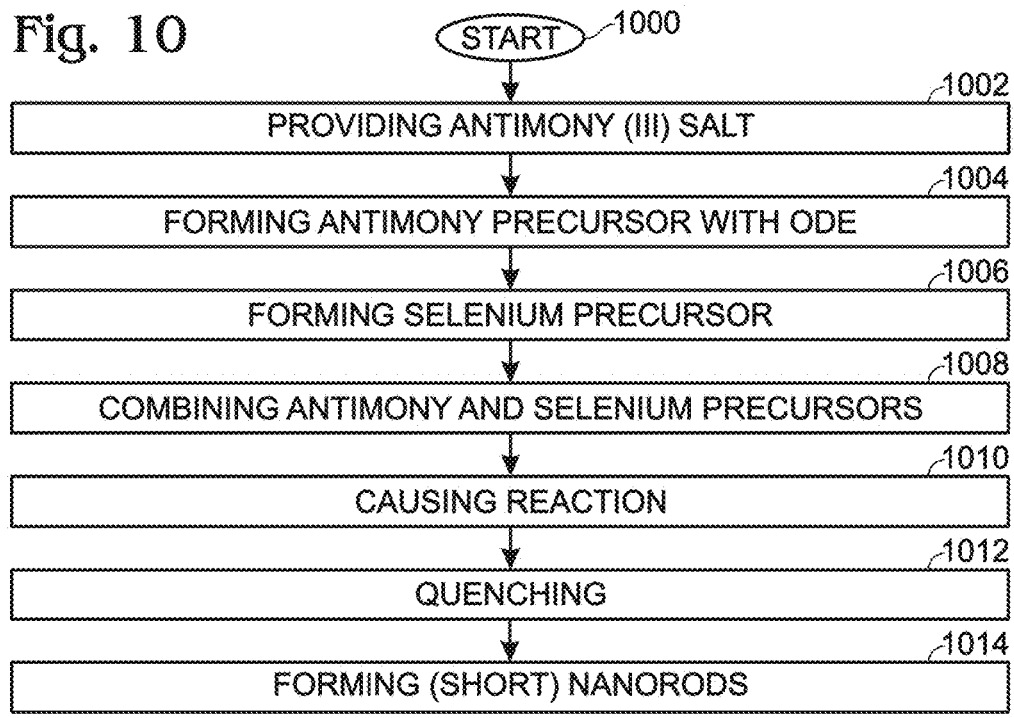

SYNTHESIS METHOD FOR CONTROLLING ANTIMONY SELENIDE NANOSTRUCTURE SHAPES

BACKGROUND OF THE INVENTION

1. Field of the Invention

This invention generally relates to methods of chemical synthesis and, more particularly, to methods for synthesizing antimony selenide nanostructures in a variety of shapes.

2. Description of the Related Art

In the current development of modern photovoltaics there is a significant demand for new materials that can potentially act as a substitute for conventional silicon. Such research and development has given rise to the cadmium telluride (CdTe) and copper indium gallium selenide (CIGS) solar cells, based on thin films technology. Moreover, hybrid organic/inorganic perovskite materials have recently emerged as sensitized architectures as a result of the constant search and evaluation of new materials as absorbers in solar cells.

Among the materials offering promise in the fabrication of solar cells, antimony—based chalcogenides represent a special subgroup. In comparison to many other materials, antimony—based chalcogenides are relatively non-toxic, earth abundant, and quite stable. The nature of their binary composition should suggest relatively simple antimony sulfide and antimony selenide preparation and handling methods. The physical properties of antimony chalcogenides, particularly the positions of the conduction and valence bands relative to the band structures of conventional electron and hole transporting materials, make them appealing candidates for photovoltaics. In addition, antimony sulfide has the advantage of an optical band gap of around 1.6 electronvolts (eV), making this material an almost ideal candidate for the tandem solar cells. In contrast, antimony selenide is a narrower band gap semiconductor material suitable as an absorber in single junction solar cells.

In particular, the most common application of antimony sulfide and antimony selenide relies on a sensitized architecture involving the mesoporous titania scaffold. Such a mesoscopic architecture provides some tolerance to the materials quality. Moreover, the band structure of both antimony semiconductors allows for the fabrication of solid sensitized solar cells. Such a device structure permits a device photovoltaic performance of up to 8.4%. However, as of yet, thin film antimony selenide solar cells have not demonstrated such efficiency. It is currently assumed that the poorer performance of antimony selenide is due to the defect states formed during the materials preparation or poor interface formation, even though selenide has been shown to produce significant photocurrents (*ACS Appl. Mater. Interfaces*, 2014, 6 (4), pp 2836-2841).

Due to the seemingly simple methods of preparation suggested by the binary nature of the material, the most common approaches for the formation of the antimony selenide have included the electrodeposition of both elements, or a chemical bath deposition. In both cases, the forming materials are initially amorphous and require an additional annealing step for conversion into a crystalline semiconductor phase. Those techniques generally provide materials with the diminished quality, resulting in the poor performances in solar cells, which mostly originates from the random distribution of the crystallites and defects within the absorber material of a solar cell.

It would be advantageous if antimony chalcogenide structures could be fabricated with a greater detail of control over their shapes and crystallinity.

SUMMARY OF THE INVENTION

Antimony chalcogenides such as antimony sulfide, antimony selenide, and antimony telluride have shown promise as materials for the fabrication of the solar cells. However, the conventional methodologies for their preparation have resulted in a poor quality of the materials, often due lack of control. Disclosed herein are methods that permit the production of various antimony chalcogenide nanostructures having a high quality, suitable for potential application in photovoltaics or other similar fields. In addition, these synthetic methods can potentially be used to prepare light emitting nanostructures based on antimony sulfide/selenide/telluride, for use in lighting and display applications.

Accordingly, a method is provided for controlling the shape of antimony selenide ($Sb_2Se_3$) nanostructures. The method dissolves an antimony (III) salt in a first amount of carboxylic acid, forming an antimony precursor. In one aspect, antimony (III) chloride is dissolved in oleic acid. Separately, selenourea is dissolved in oleylamine, forming a selenium precursor. The antimony precursor is combined with the selenium precursor to form a first solution and cause a reaction. The reaction is quenched with a solvent having a low boiling point. In response to quenching the reaction in the first solution, antimony selenide nanorods are formed, having a length in the range of 150-200 nanometers (nm) and a diameter in the range of 20 to 30 nm.

In one aspect prior to quenching, phosphine oxide (e.g., tri-n-octylphosphine (TOPO)) is added to the first solution, forming a second solution. Then, in response to quenching the reaction in the second solution, antimony selenide nanocrystals are formed having a size in a range of 1 to 5 nm.

In another aspect, 1-octadecene (ODE) and oleylamine are added to the antimony precursor, creating a first amount of a first modified antimony precursor. The first modified antimony precursor is combined with a second amount of selenium precursor to form a third solution. Then, in response to quenching the reaction in the third solution, antimony selenide hollow spheres are formed having an outside diameter in a range of 5 to 15 nm.

Alternatively, if the first amount of first modified antimony precursor is combined with a third amount of selenium precursor, greater than the second amount, a fourth solution is formed. In response to quenching the reaction in the fourth solution, antimony selenide nanoparticles are formed having a diameter in a range of 5 to 15 nm.

In another variation, the antimony precursor is formed by dissolving the antimony (III) salt in a second amount of carboxlic acid, greater than the first amount, and adding ODE to create a second modified antimony precursor. The second modified antimony precursor is combined with the selenium precursor to form a fifth solution. Then, in response to quenching the reaction in the fifth solution, antimony selenide nanorods are formed, having a length in the range of 30 to 50 nm, and a diameter in the range of 5 to 15 nm.

Additional details of the above-summarized synthesis methods are presented below.

BRIEF DESCRIPTION OF THE DRAWINGS

FIG. 7 is a flowchart summarizing the steps depicted in FIG. 2.

FIG. 8 is a flowchart illustrating a method for synthesizing antimony selenide (small) nanocrystals.

FIG. 9 is a flowchart illustrating a method for synthesizing antimony selenide nanostructures.

FIG. 10 is a flowchart illustrating a method for synthesizing antimony selenide (short) nanorods.

DETAILED DESCRIPTION

Figure 1:
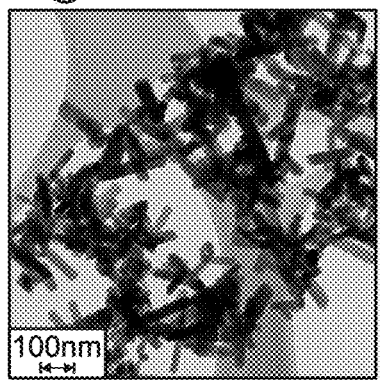
FIGS. 1 and 2 are drawings representing TEM images of a sample of $Sb_2Se_3$ (0620) at low magnification (FIG. 1) and at high magnification (FIG. 2) showing the lattice fringes.

Different approaches can be applied for the selective synthesis of antimony selenide nanostructures. Although not explicitly described, similar principles can be applied towards the preparation of antimony sulfide or antimony telluride. It should be noted that the methods disclosed herein are the first known example of the direct colloidal chemical synthesis of antimony chalcogenides. The selective preparation is based upon the proper choice of the starting material as well as reaction media. Different surfactants, present in the reaction solution, which can be specifically introduced or obtained through the decomposition of the precursors, dictate the growth of the nanostructures in particular directions. Herein is presented the preparation of the nanorods, nanocrystals, and nano-hollow spheres.

One procedure for antimony selenide nanorod preparation can be described as follows: a 200 mg of antimony (III) chloride is dissolved in 3 milliliters (mL) of oleic acid at 150° C. In a separate vial, 100 milligrams (mg) of selenourea ($SeC(NH_2)_2$) is dissolved in 1 mL of oleylamine at 200° C. Upon forming a dark red solution, the vial is cooled down to 100° C. Then, antimony precursor is heated to about 180° C. and the selenium precursor is quickly injected into the reaction mixture. After 10 seconds the reaction is quenched by the additional of 5 mL of toluene. The product (sample 0620) of the reaction is an ensemble of nanorods, which is unambiguously confirmed by transmission electron microscope (TEM).

As used herein, quenching is a rapid cooling treatment that prevents the occurrence of low-temperature processes, such as phase transformations, by only providing a narrow window of time in which a reaction is both thermodynamically favorable and kinetically accessible. It is the quenching process that stops the formation of the antimony selenide reaction at the stage of a particular tailored nanostructure. A (chemical) reaction is a process that leads to the transformation of one set of chemical substances to another. Classically, chemical reactions encompass changes that only involve the positions of electrons in the forming and breaking of chemical bonds between atoms, with no change to the nuclei (no change to the elements present), and can often be described by a chemical equation. The substance (or substances) initially involved in a chemical reaction are called reactants or reagents. Chemical reactions are usually characterized by a chemical change, and they yield one or more products, which usually have properties different from the reactants.

A colloid is one of three primary types of mixtures, with the other two being a solution and suspension. A colloid is a solution that has particles, ranging between 1 and 1000 nanometers in diameter, that are able to remain evenly distributed throughout the solution. These are also known as colloidal dispersions because the substances remain dispersed and do not settle to the bottom of the container. In colloids, one substance is evenly dispersed in another. The substance being dispersed is referred to as being in the dispersed phase, while the substance in which it is dispersed is in the continuous phase.

A precursor is a compound that participates in the chemical reaction that produces another compound.

A product is a substance that is formed during a chemical reaction.

Carboxylic acids are oxoacids having the structure $RC(=O)OH$. The term is used as a suffix in systematic name formation to denote the $—C(=O)OH$ group including its carbon atom.

Figure 2:
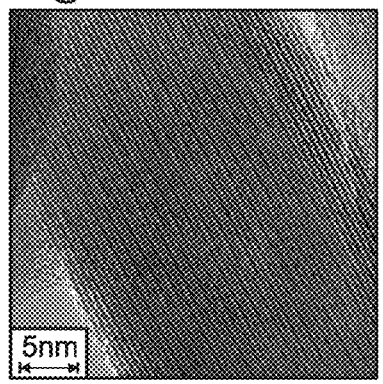

FIGS. 1 and 2 are drawings representing TEM images of a sample of $Sb_2Se_3$ (0620) at low magnification (FIG. 1) and at high magnification (FIG. 2) showing the lattice fringes. TEM analysis reveals the formation of the nanorods of antimony selenide. As used herein, a nanorod is defined as having a shape with a length greater than its other two dimensions. The cross-section is defined by the crystal structure of the material. The crystallinity of the final material was found to be perfect (FIG. 2). The sizes of the nanorods estimated by TEM images average 150-200 nm in length and 25 nm in width. Some smaller nanorods were also found with a length of about 50 nm. The growth of the nanorods can be controlled by the reaction time and the ratio of the reactants. A variation of the temperature in such a procedure leads to either bulk-type precipitate (at higher temperatures) or the formation of an amorphous material (at lower temperatures).

Figure 3:
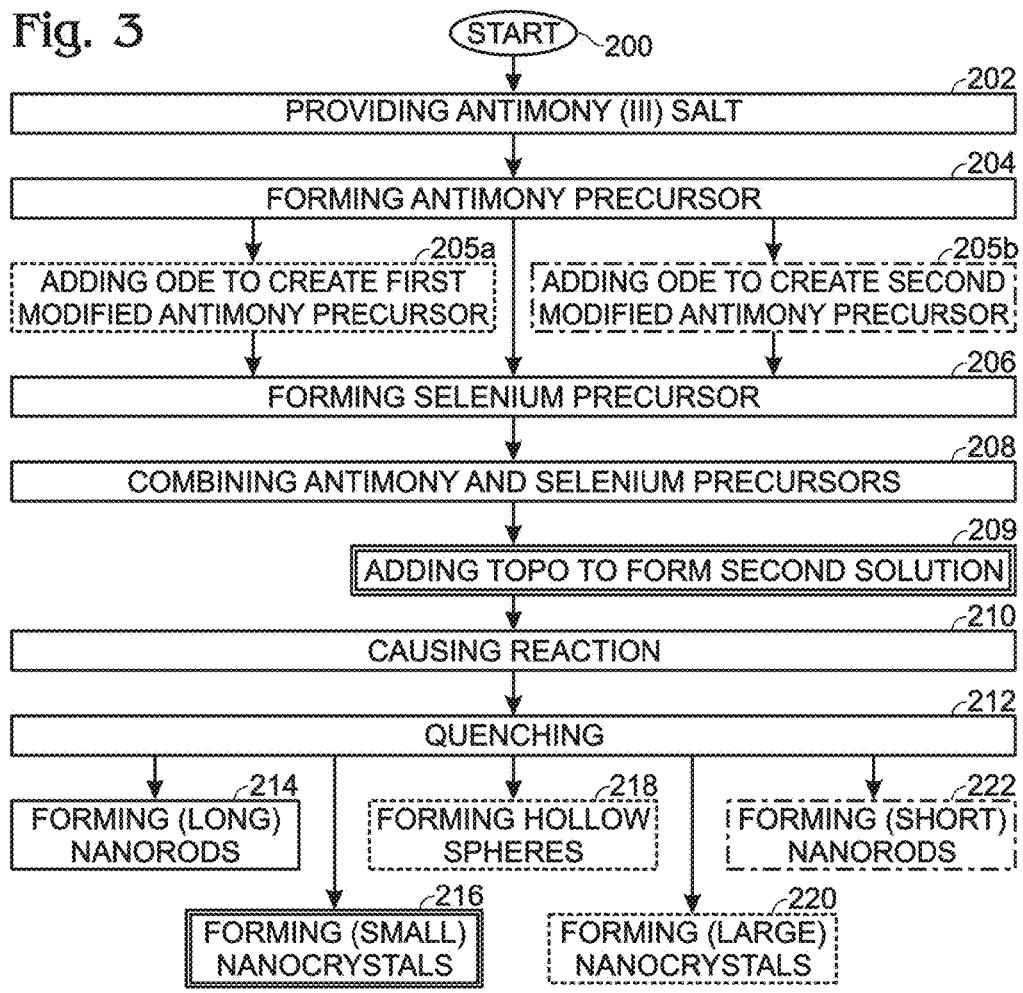
FIG. 3 is a flowchart illustrating a method for controlling the shape of antimony selenide ($Sb_2Se_3$) nanostructures.

FIG. 3 is a flowchart illustrating a method for controlling the shape of antimony selenide ($Sb_2Se_3$) nanostructures. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. However, as explained in more detail below, different nanostructures require slight modifications to the methods described immediately below. The method starts at Step 200.

Long Nanorods (Micro-Rods)

Step 202 provides antimony (III) salt. Step 204 dissolves the antimony (III) salt in a first amount of carboxylic acid (e.g., oleic acid), forming an antimony precursor. In one aspect, the antimony (III) salt is dissolved at a temperature in the range of 130 to 170° C. As used herein, the dissolution of a solid (e.g., an antimony (III) salt) into a liquid or other solvent is a process by which these original solid state become a solute (dissolved component), forming a solution of the solid in the original solvent. In the case of a crystalline solid dissolving in a liquid, crystalline structure must disintegrate such that the separate atoms, ions, or molecules are released. Step 206 dissolves selenourea in oleylamine, forming a selenium precursor. In one aspect, selenourea is dissolved in oleylamine at a temperature in the range of 180 to 220° C.

Step 208 combines the antimony precursor with the selenium precursor to form a first solution. In one aspect, Step 208 forms the first solution at a temperature in a range of 160 to 200° C. Step 210 causes a reaction. Step 212 quenches the reaction with a solvent having a low boiling point. Step 214, in response to quenching the reaction in the first solution, forms antimony selenide nanorods, having a length in the range of 150-200 nm and a diameter in the range of 20 to 30 nm.

More explicitly, Step 204 may form the antimony precursor by dissolving, proportionally, 200 mg of antimony (III) chloride in 3 mL of oleic acid at 150 degrees C. Step 206 may form the selenium precursor by dissolving, proportionally, 100 mg of selenourea with 1 mL of oleylamine at 200 degrees C., and then cooling to 100 degrees C. Step 208 may form the first solution by heating the antimony precursor to 180 degrees C. and injecting it into the selenium precursor kept at the 100 degree C. temperature. Step 210 helps cause the reaction by stirring the first solution for 10 seconds, and Step 212 quenches the reaction by adding toluene to the first solution.

Small Nanocrystals

As an alternative to the synthesis procedure used for the preparation of antimony selenide nanorods, sample 0702 was prepared at lower temperature (about 100° C.) with the addition of tri-n-octylphosphine oxide (TOPO) (0.75 g) in the reaction. TOPO is a well-known surface ligand used for the preparation of the quantum dots, which was expected to suppress nanorod formation and growth. After quenching, no precipitation or any sign of aggregation was observed.

Phosphines are $PH_3$, and compounds are derived from it by substituting one, two, or three hydrogen atoms with hydrocarbyl groups $R_3P$. $RPH_2$, $R_2PH$, and $R_3P$ (R≠H) are called primary, secondary, and tertiary phosphines, respectively. One specific phosphine is named as a substituted phosphane, e.g. $CH_3PH_2$ methylphosphane. Phosphine oxides are compounds having the structure $R_3P=O$ mesomer-arrow $R_3P^+$—$O^-$.

Figure 4:
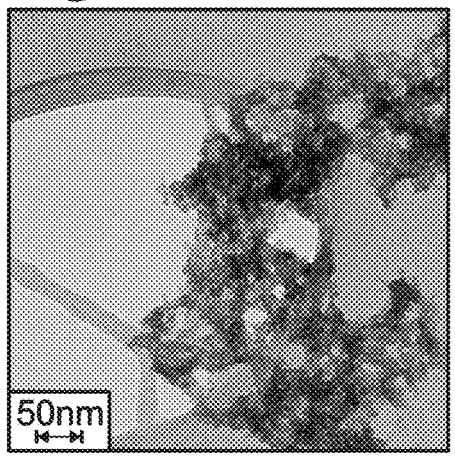
FIG. 4 is a drawing representing the TEM analysis of antimony selenide sample 0702.

FIG. 4 is a drawing representing the TEM analysis of antimony selenide sample 0702. The analysis reveals that the reaction mixture consists of: a) extra-small nanocrystals with a size of 1-2 nm, and b) a significant amount of the amorphous aggregates which were seen during antimony selenide synthesis. A nanocrystal is a material particle having at least one dimension smaller than 100 nanometers (a nanoparticle) and composed of atoms in either a single- or poly-crystalline arrangement. The results confirmed that low temperatures and the addition of TOPO are the key factors in preparing this type of nano-material. Thus, the modification of the standard procedure (Steps 202 to 214) by the addition of TOPO leads to inhibited growth of the forming particles. This result also suggests that TOPO may be a good passivating ligand for nanoparticles of that type. To summarize, by adding or eliminating TOPO, either nanorods or ultra-small nanoparticles of antimony selenide can be synthesized.

Returning to FIG. 3, prior to quenching (Step 212), Step 209 adds phosphine oxide (e.g., tri-n-octylphosphine (TOPO)) to the first solution, forming a second solution. In response to quenching the reaction in the second solution, Step 216 forms antimony selenide nanocrystals having a size in a range of 1 to 5 nm. For example, Step 209 adds phosphine oxide to the first solution by combining phosphine oxide, the antimony precursor, and the selenium precursor at a temperature in a range of 80 to 120° C.

In one aspect, Step 204 forms the antimony precursor by dissolving, proportionally, 200 mg of antimony (III) chloride in 3 mL of oleic acid at 150 degrees C. Step 206 may form the selenium precursor by dissolving, proportionally, 100 mg of selenourea with 1 mL of oleylamine at 200 degrees C., and then cooling to 100 degrees C. Step 208 may form the first solution by heating the antimony precursor to 100 degrees C. and injecting it into the selenium precursor kept at the 100 degree C. temperature. Step 209 adds, proportionally, 0.75 grams (g) of TOPO to the first solution.

Alternatively, 0.132 grams (g) of antimony(III) chloride, 0.72 mL of oleylamine, 0.56 mL of oleic acid, and 6.3 mL of 1-octadecene (ODE) were placed in 3-neck round bottom flask equipped with the stirring bar and thermocouple in the glovebox. The flask was closed, removed from the glovebox and heated under vacuum at 130° C. for 30 minutes using a heating mantle. The reaction was pumped and purged three times with nitrogen ($N_2$) and the temperature was slowly raised to 150° C. under vacuum, then switched to $N_2$ and heated to 180° C. At this time the solution appeared clear. Meanwhile, a solution containing 0.15 g of selenourea in 1.25 mL of oleylamine was prepared in the glovebox at 150° C. The selenium (Se)-containing precursor was quickly injected into the reaction flask at 180° C. and the reaction was immediately quenched by the injection of 3 mL of hexane. The reaction mixture (sample 0919) was analyzed by scanning TEM (STEM). Due to the presence of the excess ligand, TEM did not provide any reliable information, but STEM images showed the presence of the ultrasmall nanocrystals around 1 nm size.

Hollow Spheres

To obtain nanocrystals of a larger size or different shape, the injection temperature was lowered to 170° C. and the reaction time was extended to 10 seconds (sample 0927), which technically should improve the growth of the material, although too low of a temperature may promote the formation of amorphous material. The TEM images revealed the formation of hollow microspheres with a diameter of about 10 nm.

Figure 5:
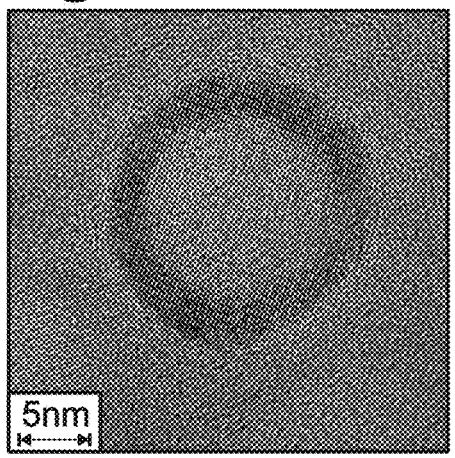
FIG. 5 is a drawing representing a TEM image of $Sb_2Se_3$ sample 0927 showing a hollow nanosphere.

FIG. 5 is a drawing representing a TEM image of $Sb_2Se_3$ sample 0927 showing a hollow nanosphere. Among the hollow nanospheres a few nanocrystals were found as well as the bi-product of the reaction (not shown on the figure). The prepared sample can be purified by the addition of ethanol and the resulting precipitated particles can be dispersed in toluene.

Returning to FIG. 2, Step 205*a* adds 1-octadecene (ODE) and oleylamine to the antimony precursor, creating a first amount of a first modified antimony precursor. Then, Step 208 combines the first modified antimony precursor with a second amount of selenium precursor to form a third solution. In response to quenching the reaction in the third solution, Step 218 forms antimony selenide hollow spheres having an outside diameter in a range of 5 to 15 nm. As used herein, a hollow sphere or hollow nanosphere has a spherical shape with an outside diameter, an antimony selenide shell, and a hollow inside diameter. The inside and outside diameters are in the range of 1 to 100 nm, with the inside diameter being at least 1 nm smaller than the outside diameter.

In one aspect, Step 208 combines the first amount of first modified antimony precursor with the second amount of selenium precursor at a temperature of in the range of 180 to 200 degrees C. In another aspect, creating the first amount of first modified antimony precursor in Step 205*a* includes combining, proportionally, 0.132 g of antimony (III) chloride, 0.72 mL of oleylamine, 0.56 mL of oleic acid, and 6.3 mL of ODE, heating at a temperature of 130 degrees C. for 30 minutes, and then heating to 180 degrees C. Step 206 forms the selenium precursor by dissolving, proportionally, 0.16 g of selenourea with 1.25 mL of oleylamine at 150 degrees C., and then cooling to 100 degrees C. Step 208 forms the third solution by keeping the selenium precursor at 100 degrees C. and injecting it into the 180 degree C. temperature first modified antimony precursor, and Step 212 quenches the reaction by adding hexane to the third solution.

Larger Nanocrystals

In order to facilitate the formation of nanocrystals or quantum dots of antimony selenide, the amount of selenium precursor was increased to 200 mg and, using the same conditions, sample 1018 was prepared. The results obtained by TEM showed the formation of the nanoparticles of a size of around 10 nm. Thus, Step 208 combines the first amount of first modified antimony precursor with a third amount of selenium precursor, greater than the second amount, to form a fourth solution. In response to quenching the reaction in the fourth solution, Step 220 forms antimony selenide nanoparticles having a diameter in a range of 5 to 15 nm.

In one aspect, creating the first amount of first modified antimony precursor (Step 205a) includes combining, proportionally, 0.132 g of antimony (III) chloride, 0.72 mL of oleylamine, 0.56 mL of oleic acid, and 6.3 mL of ODE, heating at a temperature of 130 degrees C. for 30 minutes, and then heating to 180 degrees C. Step 206 forms the selenium precursor by dissolving, proportionally, 0.2 g of selenourea with 1.25 mL of oleylamine at 150 degrees C., and then cooling to 100 degrees C. Step 208 forms the third solution by keeping the selenium precursor solution at 100 degrees C. and injecting it into the 180 degree C. temperature first modified antimony precursor, and Step 212 quenches the reaction by adding hexane to the third solution.

Short Nanorods

Figure 6:
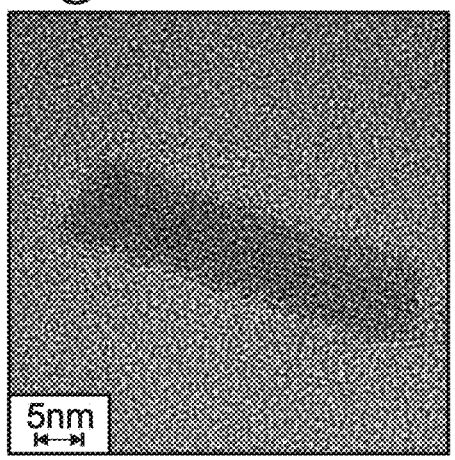
FIG. 6 is a drawing representing a TEM image of an antimony selenide nanorod.

FIG. 6 is a drawing representing a TEM image of an antimony selenide nanorod. By eliminating the oleylamine in the initial mixture and increasing the amount of oleic acid, sample 1026 was prepared. TEM images of the sample revealed nanorods with about a 10 nm diameter and about 30-50 nm in length. The elemental composition of sample 1026 was obtained using energy-dispersive X-ray spectroscopy (EDX). Thus, the presence of oleylamine allows for control the morphology to enable the formation of nanocrystals. Such a discovery allows for the controlled growth of antimony selenide nanocrystals. The composition of the nanorods was measured using EDX and found to be $Sb_2Se_{4.8}$, which suggests that the surface of the nanorods was Se-rich.

In this aspect Step 204 forms the antimony precursor by dissolving the antimony (III) salt in a second amount of carboxlic acid, greater than the first amount, and Step 205b adds ODE to create a second modified antimony precursor. Step 208 combines the second modified antimony precursor with the selenium precursor and forms a fifth solution. In response to quenching the reaction in the fifth solution, Step 222 forms antimony selenide nanorods, having a length in the range of 30 to 50 nm, a diameter in the range of 5 to 15 nm.

In one aspect, Steps 204 and 205b can be merged so that the second modified antimony precursor is formed by combining, proportionally, 0.132 g of antimony (III) chloride, 0.56 mL of oleic acid, and 6.3 mL of ODE, heating at a temperature of 130 degrees C. for 30 minutes, and then heating to 180 degrees C. Step 206 forms the selenium precursor by dissolving, proportionally, 0.16 of selenourea with 1.25 mL of oleylamine at 150 degrees C., and then cooling to 100 degrees C. Step 208 forms the fifth solution by keeping the selenium precursor at 100 degrees C. and injecting it into the 180 degree C. temperature antimony precursor. Step 212 quenches the reaction by adding hexane to the fifth solution.

In summary, the combination of oleic acid and oleylamine is important for the control of the particle size and morphology. In particular, increasing the amount of oleic acid with respect to oleylamine, leads to the formation of the nanorods instead of nanocrystals. Evaluations were made where the amount of oleylamine was made significantly higher than in the original (long nanorod) procedure. The amount of oleylamine loaded into the reaction mixture was doubled, and the reaction was carried out in the exactly same fashion as before. The samples prepared by this procedure were analyzed by TEM, which revealed that under the same conditions, the presence of the additional amount of oleylamine significantly inhibits the growth of the nanoparticles.

Thus, the present disclosure demonstrates the tunability of the synthetic route for the preparation of antimony selenide nanoparticles. Although not explicitly demonstrated, the same synthesis procedures can be used for the preparation of the antimony sulfide and antimony telluride as well.

FIG. 7 is a flowchart summarizing the steps depicted in FIG. 2. Step 700 represents the standard procedure for the formation of the longer nanorods (Steps 202 to 214, FIG. 2), which may also be referred to as micro-rods. If TOPO is added in Step 702, nanocrystalline seeds, which are defined as nanocrystals with a size of 1-2 nm, are formed in Step 704 (Steps 202 to 216, FIG. 2). If octadecene is made the primary solvent in Step 706, the result is hollow spheres (nanospheres) in Step 708 (Steps 202 to 218, FIG. 2). By increasing the selenium precursor in Step 710, the result is nanocrystals in Step 712 (Steps 202 to 220, FIG. 2). The nanocrystals of Step 712 are larger in size than those formed in Step 704. By eliminating oleylamine and increasing the oleic acid in the Step 714, the result is the nanorods of Step 716 (Steps 202 to 222, FIG. 2). The nanorods of Step 716 are smaller than the ones formed using the standard procedure of Step 700.

FIG. 8 is a flowchart illustrating a method for synthesizing antimony selenide (small) nanocrystals. The method begins at Step 800. Step 802 provides antimony (III) salt. Step 804 dissolves the antimony (III) salt in carboxylic acid, forming an antimony precursor. Step 806 dissolves selenourea in oleylamine, forming a selenium precursor. Step 808 combines the antimony precursor with the selenium precursor to form a first solution. Step 810 adds phosphine oxide to the first solution, forming a second solution. Step 812 causes a reaction. Step 814 quenches the reaction with a solvent having a low boiling point. Step 816, in response to quenching the reaction in the second solution, forms antimony selenide nanocrystals having a size in a range of 1 to 5 nm. More explicit details of this method have been presented above.

FIG. 9 is a flowchart illustrating a method for synthesizing antimony selenide nanostructures. The method begins at Step 900. Step 902 provides antimony (III) salt. Step 904 dissolves the antimony (III) salt in carboxylic acid with oleylamine and ODE, forming an antimony precursor. Step 906 dissolves selenourea in oleylamine, forming a first amount of selenium precursor. Step 908 combines the antimony precursor with the first amount of selenium precursor to form a first solution. Step 910 causes a reaction. Step 912 quenches the reaction with a solvent having a low boiling point. In response to quenching the reaction in the first solution, Step 914 forms antimony selenide hollow spheres having an outside diameter in a range of 5 to 15 nm.

In one aspect, Step 908 combines the antimony precursor with a second amount of selenium precursor, greater than the first amount of selenium precursor. In response to quenching the reaction in the first solution, Step 916 forms antimony selenide nanoparticles having a diameter in a range of 5 to 15 nm. More explicit details of this method have been presented above.

FIG. 10 is a flowchart illustrating a method for synthesizing antimony selenide (short) nanorods. The method begins at Step 1000. Step 1002 provides antimony (III) salt. Step 1004 dissolves the antimony (III) salt in carboxylic acid with ODE, forming an antimony precursor. Step 1006 dissolves selenourea in oleylamine, forming a selenium precursor. Step 1008 combines the antimony precursor with the selenium precursor to form a first solution. Step 1010 causes a reaction. Step 1012 quenches the reaction with a solvent having a low boiling point. In response to quenching the reaction in the first solution, Step 1014 forms antimony selenide nanorods, having a length in a range of 30 to 50 nm, a diameter in a range of 5 to 15 nm.

Antimony selenide synthesis methods have been provided that permit the shape of the resulting nanostructures to be "tuned". Examples of particular experiments and component ratios have been presented to illustrate the invention. However, the invention is not limited to merely these examples. Although antimony selenide structures are described in detail, the methods also apply to antimony sulfide and antimony telluride structure synthesis. Other variations and embodiments of the invention will occur to those skilled in the art.

I claim:

1. A method for controlling the shape of antimony selenide ($Sb_2Se_3$) nanostructures, the method comprising:
   providing antimony (III) salt;
   dissolving the antimony (III) salt in a first amount of carboxylic acid, forming an antimony precursor;
   dissolving selenourea in oleylamine, forming a selenium precursor;
   combining the antimony precursor with the selenium precursor to form a first solution;
   causing a reaction;
   quenching the reaction with a solvent having a low boiling point; and,
   in response to quenching the reaction in the first solution, forming antimony selenide nanorods, having a length in a range of 150-200 nanometers (nm) and a diameter in a range of 20 to 30 nm.

2. The method of claim 1 wherein dissolving the antimony (III) salt in the first amount of carboxylic acid includes dissolving at a temperature in a range of 130 to 170° C.

3. The method of claim 1 wherein dissolving selenourea in oleylamine includes dissolving at a temperature in a range of 180 to 220° C.

4. The method of claim 1 wherein dissolving the antimony (III) salt in the first amount of carboxylic acid includes dissolving antimony (III) chloride in oleic acid.

5. The method of claim 1 wherein forming the first solution includes forming the first solution at a temperature in a range of 160 to 200° C.

6. The method of claim 1 wherein forming the antimony precursor includes dissolving, proportionally, 200 milligrams (mg) of antimony (III) chloride in 3 milliliters (mL) of oleic acid at 150 degrees C.;
   wherein forming the selenium precursor includes dissolving, proportionally, 100 mg of selenourea with 1 mL of oleylamine at 200 degrees C., and then cooling to 100 degrees C.;
   wherein forming the first solution includes heating the antimony precursor to 180 degrees C. and injecting it into the selenium precursor kept at the 100 degree C. temperature;
   wherein causing the reaction includes stirring the first solution for 10 seconds; and,
   wherein quenching the reaction includes adding toluene to the first solution.

7. The method of claim 1 wherein forming the antimony precursor includes dissolving the antimony (III) salt in a second amount of carboxlic acid, greater than the first amount;
   the method further comprising:
   adding ODE to the antimony precursor to create a second modified antimony precursor;
   wherein combining the second modified antimony precursor with the selenium precursor includes forming a fifth solution; and,
   in response to quenching the reaction in the fifth solution, forming antimony selenide nanorods, having a length in a range of 30 to 50 nm, and a diameter in a range of 5 to 15 nm.

8. The method of claim 7 wherein forming the second modified antimony precursor includes combining, proportionally, 0.132 g of antimony (III) chloride, 0.56 mL of oleic acid, and 6.3 mL of ODE, heating at a temperature of 130 degrees C. for 30 minutes, and then heating to 180 degrees C.;
   wherein forming the selenium precursor includes dissolving, proportionally, 0.16 of selenourea with 1.25 mL of oleylamine at 150 degrees C., and then cooling to 100 degrees C.;
   wherein forming the fifth solution includes keeping the selenium precursor at 100 degrees C. and injecting it into the 180 degree C. temperature antimony precursor; and,
   wherein quenching the reaction includes adding hexane to the fifth solution.

9. A method for synthesizing antimony selenide ($Sb_2Se_3$) nanocrystals, the method comprising:
   providing antimony (III) salt;
   dissolving the antimony (III) salt in carboxylic acid, forming an antimony precursor;
   dissolving selenourea in oleylamine, forming a selenium precursor;
   combining the antimony precursor with the selenium precursor to form a first solution;
   adding phosphine oxide to the first solution, forming a second solution;
   causing a reaction;
   quenching the reaction with a solvent having a low boiling point; and,
   in response to quenching the reaction in the second solution, forming antimony selenide nanocrystals having a size in a range of 1 to 5 nanometers (nm).

10. The method of claim 9 wherein adding phosphine oxide to the first solution includes combining phosphine oxide, the antimony precursor, and the selenium precursor at a temperature in a range of 80 to 120° C.

11. The method of claim 9 wherein adding phosphine oxide to the first solution includes adding tri-n-octylphosphine (TOPO) to the first solution.

12. The method of claim 11 wherein forming the antimony precursor includes dissolving, proportionally, 200 mg of antimony (III) chloride in 3 mL of oleic acid at 150 degrees C.;
   wherein forming the selenium precursor includes dissolving, proportionally, 100 mg of selenourea with 1 mL of oleylamine at 200 degrees C., and then cooling to 100 degrees C.;

wherein forming the first solution includes heating the antimony precursor to 100 degrees C. and injecting it into the selenium precursor kept at the 100 degree C. temperature; and wherein adding TOPO to the first solution includes adding, proportionally, 0.75 grams (g) of TOPO.

13. A method for synthesizing antimony selenide ($Sb_2Se_3$) nanostructures, the method comprising:
providing antimony (III) salt;
dissolving the antimony (III) salt in carboxylic acid with oleylamine and 1-octadecene (ODE), forming a first amount of antimony precursor;
dissolving selenourea in oleylamine, forming a second amount of selenium precursor;
combining the antimony precursor with the second amount of selenium precursor to form a first solution;
causing a reaction;
quenching the reaction with a solvent having a low boiling point; and,
in response to quenching the reaction in the first solution, forming antimony selenide hollow spheres having an outside diameter in a range of 5 to 15 nanometers (nm).

14. The method of claim 13 wherein combining the first amount of antimony precursor with the second amount of selenium precursor includes combining at a temperature of in a range of 180 to 200 degrees C.

15. The method of claim 13 wherein creating the first amount of antimony precursor includes combining, proportionally, 0.132 g of antimony (III) chloride, 0.72 mL of oleylamine, 0.56 mL of oleic acid, and 6.3 mL of ODE, heating at a temperature of 130 degrees C. for 30 minutes, and then heating to 180 degrees C.;
wherein forming the selenium precursor includes dissolving, proportionally, 0.16 g of selenourea with 1.25 mL of oleylamine at 150 degrees C., and then cooling to 100 degrees C.;
wherein forming the first solution includes keeping the selenium precursor at 100 degrees C. and injecting it into the 180 degree C. temperature antimony precursor; and,
wherein quenching the reaction includes adding hexane to the first solution.

16. A method for synthesizing antimony selenide ($Sb_2Se_3$) nanostructures, the method comprising:
providing antimony (III) salt;
dissolving the antimony (III) salt in carboxylic acid with oleylamine and 1-octadecene (ODE), forming a first amount of antimony precursor;
dissolving selenourea in oleylamine, forming a second amount of selenium precursor;
combining the antimony precursor with the second amount of selenium precursor to form a first solution;
causing a reaction;
quenching the reaction with a solvent having a low boiling point; and,
in response to quenching the reaction in the first solution, forming antimony selenide nanoparticles having a diameter in a range of 5 to 15 nanometers (nm).

17. The method of claim 16 wherein creating the first amount of antimony precursor includes combining, proportionally, 0.132 g of antimony (III) chloride, 0.72 mL of oleylamine, 0.56 mL of oleic acid, and 6.3 mL of ODE, heating at a temperature of 130 degrees C. for 30 minutes, and then heating to 180 degrees C.;
wherein forming the selenium precursor includes dissolving, proportionally, 0.2 of selenourea with 1.25 mL of oleylamine at 150 degrees C., and then cooling to 100 degrees C.;
wherein forming the first solution includes keeping the selenium precursor at 100 degrees C. and injecting it into the 180 degree C. temperature antimony precursor; and,
wherein quenching the reaction includes adding hexane to the first solution.

18. A method for synthesizing antimony selenide ($Sb_2Se_3$) nanorods, the method comprising:
providing antimony (III) salt;
dissolving the antimony (III) salt in carboxylic acid with 1-octadecene (ODE), forming an antimony precursor;
dissolving selenourea in oleylamine, forming a selenium precursor;
combining the antimony precursor with the selenium precursor to form a first solution;
causing a reaction;
quenching the reaction with a solvent having a low boiling point; and,
in response to quenching the reaction in the first solution, forming antimony selenide nanorods, having a length in a range of 30 to 50 nanometers (nm), a diameter in a range of 5 to 15 nm.

* * * * *